(12) United States Patent
Satoh et al.

(10) Patent No.: US 8,723,281 B2
(45) Date of Patent: May 13, 2014

(54) ACCESS TRANSISTOR WITH A BURIED GATE

(75) Inventors: Kimihiro Satoh, Beaverton, OR (US); Ebrahim Abedifard, Sunnyvale, CA (US)

(73) Assignee: Avalanche Technology Inc., Fremont, CA (US)

( * ) Notice: Subject to any disclaimer, the term of this patent is extended or adjusted under 35 U.S.C. 154(b) by 204 days.

(21) Appl. No.: 13/070,355

(22) Filed: Mar. 23, 2011

(65) Prior Publication Data

US 2012/0241826 A1 Sep. 27, 2012

(51) Int. Cl.
*H01L 29/82* (2006.01)

(52) U.S. Cl.
USPC ............. 257/421; 257/295; 257/E29.323; 356/158; 356/171

(58) Field of Classification Search
USPC .......... 257/295, E29.323, 421; 365/158, 171
See application file for complete search history.

(56) References Cited

U.S. PATENT DOCUMENTS

2006/0034117 A1* 2/2006 Jeong et al. .............. 365/158
2009/0059654 A1* 3/2009 Mani ........................ 365/151

OTHER PUBLICATIONS

U.K. Klostermann, M. Angerbauer, U. Gruning, F. Kreupl, M. Ruhrig, F. Dahmani, M. Kund, G. Muller; "A Perpendicular Spin Torque Switching based MRAM for the 28 nm Technology Node"; IEEE Trans. Magn.,p. 187-190 (2007).

* cited by examiner

*Primary Examiner* — Elias M Ullah
(74) *Attorney, Agent, or Firm* — Ipxlaw Group LLP; Maryam Imam; Bing K. Yen

(57) ABSTRACT

A magnetic memory cell is formed including a magneto tunnel junction (MTJ) and an access transistor, which is used to access the MTJ in operation. The access transistor, which is formed on a silicon substrate, includes a gate, drain and source with the gate position substantially perpendicular to the plane of the silicon substrate thereby burying the gate and allowing more surface area on the silicon substrate for formation of additional memory cells.

6 Claims, 16 Drawing Sheets

ACCESS TRANSISTOR WITH A BURIED GATE

BACKGROUND OF THE INVENTION

1. Field of the Invention

The present invention relates generally to an access transistor used to access memory and method of fabricating the same, and more particularly to an access transistor with a small form factor.

2. Description of the Prior Art

Magnetic random access memory (MRAM) is rapidly gaining popularity as its use in replacing conventional memory is showing promise. Magnetic tunnel junctions (MTJs), which are essentially the part of the MRAM that store information, include various layers that determine the magnetic behavior of the device. An MTJ is typically formed with an accompanying access transistor used to select (or access) the MTJ for programming and/or reading. The MTJ and access transistor are herein referred to as a "magnetic memory cell". Currently, the size of such a combination is typically 14 $F^2$, with "F" representing feature size. Such a form factor prevents magnetic memory cells from readily replacing other memory, such as dynamic random access memory (DRAM), which is typically 6 $F^2$ and NAND flash memory, which is typically 4 $F^2$. For the benefits experienced by magnetic memory cells, such as long life expectancy and avoidance of the limitations currently experienced with fabrication of silicon-based memory, it is highly desirable to manufacture magnetic memory cells that resemble a form factor similar to that of DRAM so that the latter can be replaced by the former.

One of the reasons for current magnetic memory cell's large sizes is the formation of the access transistor. Currently, access transistors are formed horizontally, relative to the plane of the silicon substrate, beside and under the MTJ. Such a configuration limits efficient use of the surface of the silicon substrate and results in a large memory cell size.

Current prior art technology uses 6 $F^2$ perpendicular Spin Torque (PST) MRAM cell. Problems with the memory cell includes low drive current, the current required to effectively access the MTJ, punch through leakage due to the short channel and lack of sufficient space for making contact in between.

Thus, the need arises for reducing the size of an access transistor.

SUMMARY OF THE INVENTION

Briefly, a magnetic memory cell is disclosed, formed of a magneto tunnel junction (MTJ) and an access transistor, which is used to access the MTJ in operation. The access transistor includes a gate, drain, and source with the gate positioned substantially perpendicular to the plane of the silicon substrate thereby burying the gate to allow additional surface area on the silicon substrate for formation of additional memory cells.

In alternative embodiments, rather than a MTJ, other types of suitable memory may be employed with the gate of the access transistor that is used to access the memory being buried in the silicon substrate or substantially perpendicular to the plane of the silicon substrate. Examples of such memory include a phase shift memory, resistive memory or any other memory having a switching memory element.

These and other objects and advantages of the present invention will no doubt become apparent to those skilled in the art after having read the following detailed description of the various embodiments illustrated in the several figures of the drawing.

IN THE DRAWINGS

DETAILED DESCRIPTION OF THE PREFERRED EMBODIMENTS

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the present invention. It should be noted that the figures discussed herein are not drawn to scale and thicknesses of lines are not indicative of actual sizes.

In an embodiment of the present invention, a magnetic memory cell and a method of fabricating the same are disclosed. A magnetic memory cell is formed including a magneto tunnel junction (MTJ) and an access transistor, which is used to access the MTJ in operation. The access transistor, which is formed on a silicon substrate, includes a gate, drain, and source with the gate position substantially perpendicular to the plane of the silicon substrate thereby burying the gate and allowing more surface area on the silicon substrate for formation of additional memory cells.

Figure 1:
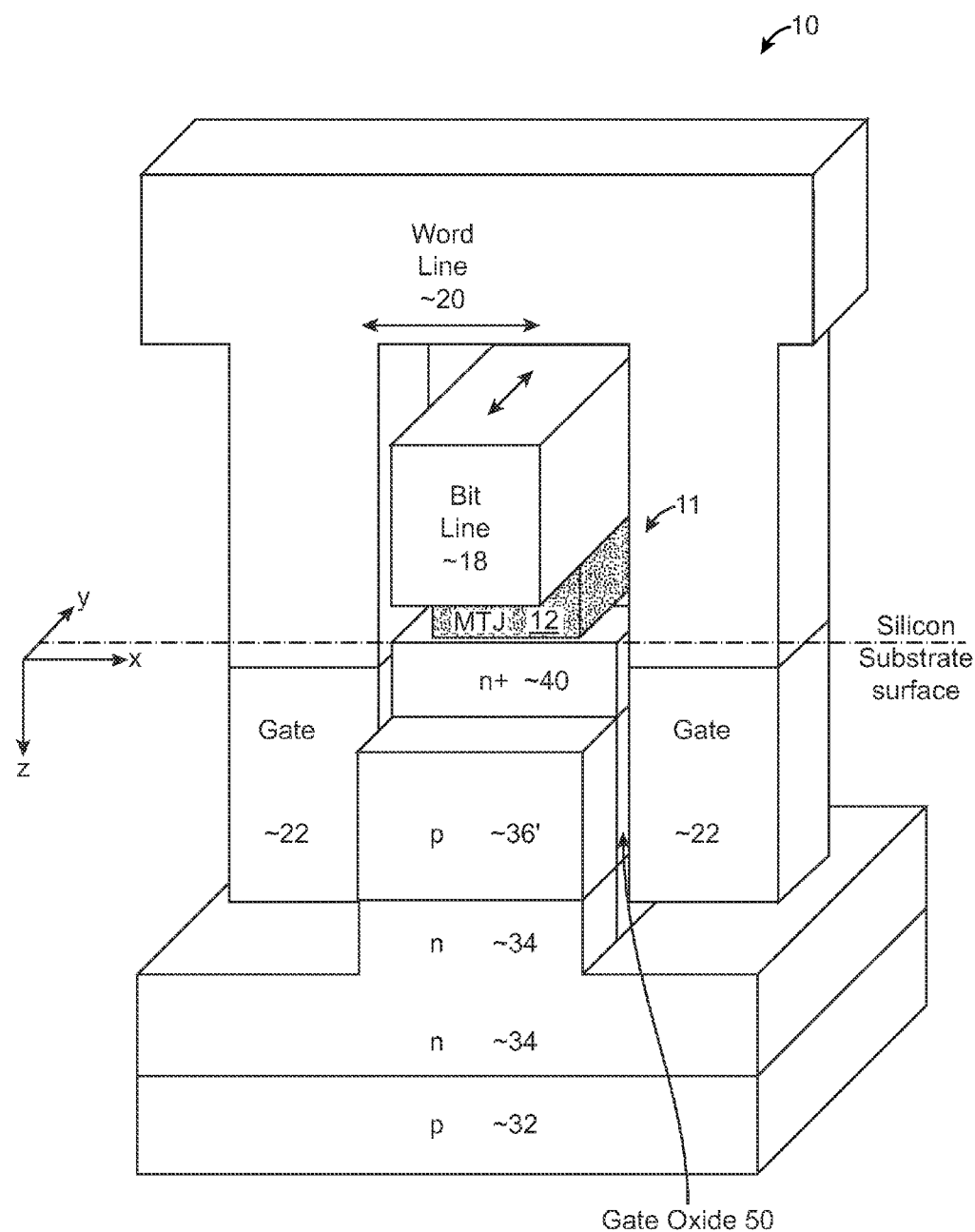
FIG. 1 shows a three-dimensional perspective view of the array 10 showing one of the magnetic memory cells thereof.

FIG. 1 shows a three-dimensional perspective view of a portion of a magnetic memory array 10, in accordance with an embodiment of the present invention. The array 10 is shown to include a silicon substrate 32 on top of which an access transistor source 34 is formed and on a portion of the top of the source 34 is shown formed transistor channel area 36', on top of the area 36' is shown formed an access transistor drain 40. In the array 10, on top of a portion of the source 34 that is different than the portion thereof where the area 36' resides is shown formed an access transistor gate 22. The silicon substrate 32, source 34, area 36', drain 40 and gate 22 reside substantially below the surface of the silicon substrate in which the array 10 is built. On top of the drain 40 is shown formed a magneto tunnel junction (MTJ) 12 on top of which is shown a portion of the bit line 18. Accordingly, the MTJ 12 is coupled to the bit line 18. Further, the word line 20 is shown formed on top of the gate 22 thereby coupling the word line 20 to the gate 22 of the access transistor, defined by the source 34, drain 40 and gate 22. The MTJ 12, bit line 18 and word line 20 are formed substantially above the surface of the silicon substrate. The access transistor and MTJ 12 collectively form a magnetic memory element 11. The magnetic memory element 11 further includes a top electrode and a bottom electrode, not shown in FIG. 1. The top electrode is formed on top of the MTJ 12 and below the bit line 18 and the bottom electrode is formed below the MTJ 12 and on top of the drain 40.

It is noted that, in FIG. 1, the word line 20 is formed in a direction along the x-axis, as shown, and the bit line is formed along the y-axis and the silicon substrate is formed along the z-axis.

The coupling of the MTJ 12 with the bit line 18 allows for voltage to be provided to the MTJ 12 during operation of the array 100. The MTJ 12 is coupled to the source 34 under the control of the access transistor.

In some embodiments the access transistor is an n-channel metal-oxide-semiconductor field-effect transistor (NMOS) where the area 36' is made of a p-region and the drain 40 is made of a n-region and the source 34 is made of a n-region and the silicon substrate 32 is made of a p-region. In other embodiments, the access transistor is a p-channel metal-oxide-semiconductor field-effect transistor (PMOS) where the area 36' is made of a n-region, the drain 40 is made of a p-region and the source 34 is made of a p-region and the silicon substrate 32 is made of a n-region. In the latter case, negative voltage is applied to the gate 22, during operation of the array 10. It is understood that in either configuration, the source 34 has an opposite polarity relative to the area 36', similarly, the drain 40 has an opposite polarity relative to the area 36'. The drain 40 has the same polarity as the source 34. For example, in the case where the access transistor is an NMOS type of transistor, the source 34 is an n-region and opposite to the polarity of the area 36', which is made of a p-region.

In FIG. 1, a gate oxide 50, also a part of the access transistor, extends along the z-axis. As will be evident in subsequent figures, a channel 51 is formed in the area 36', adjacent to the gate 22, when a positive gate voltage is applied to the gate 22 and the area 36' is grounded. This applies to the case where the access transistor is an NMOS type of transistor, for the case where the access transistor is a PMOS type of transistor, a negative voltage or '0' volts is applied to the gate 22 and a positive voltage is applied to the area 36' to form the channel 51. The channel 51 effectively couples the MTJ 12 to the source 34 and advantageously allows for an increased source-drain current of approximately twice that offered by conventional single channel designs.

In the case of an NMOS type of transistor, when '0' Volts or a negative voltage is applied to the gate 22 and the area 36' is grounded, the channel 51 is not formed and the MTJ 12 is effectively disconnected from the source 34. Similarly, in the case where the access transistor is a PMOS type of transistor, when a positive voltage, or '0' volts, is not applied to the gate 22, the channel 51 is not formed and the MTJ 12 is effectively disconnected from the source 34. The word line 20 provides voltage to the gate 22 thereby controlling the formation of the channel 51. As will be evident shortly, the channel 51 is a "dual channel" because two channels are formed on opposite sides of the gate 22.

Accordingly, the access transistor of FIG. 1 has a vertical gate, i.e. gate 22, because the gate 22 is buried in the silicon substrate and extends vertically along the z-axis or along the silicon substrate and therefore advantageously reduces the area of the cell 11 over that of prior art access transistors. In some embodiments, the size of the cell 11 is reduced to 5 $F^2$ compared to prior art cell sizes of 12 $F^2$. More specifically, the size of the cell 11 is 2.5 F, along the x-axis, and 2 F, along the y-axis because, along the x-axis, the width of the bit line 18 is F and the space between the two MTJs is F, and the space between the gate 22 and the bit line 18, 0.25 F, and along the y-axis, the size of the MTJ 12 is 1 F by 1 F in the case where the MTJ 12 is square-shaped, as shown in FIG. 2.

In the case where the MTJ 12 is oval-shaped, the cell size is mainly dominated by the MTJ 12. It is understood that an oval-shaped MTJ has a dimension larger in one direction than the other and the cell size is therefore affected accordingly.

It is understood that the word line 20 and the gate 22 are made of the same material.

Figure 2:
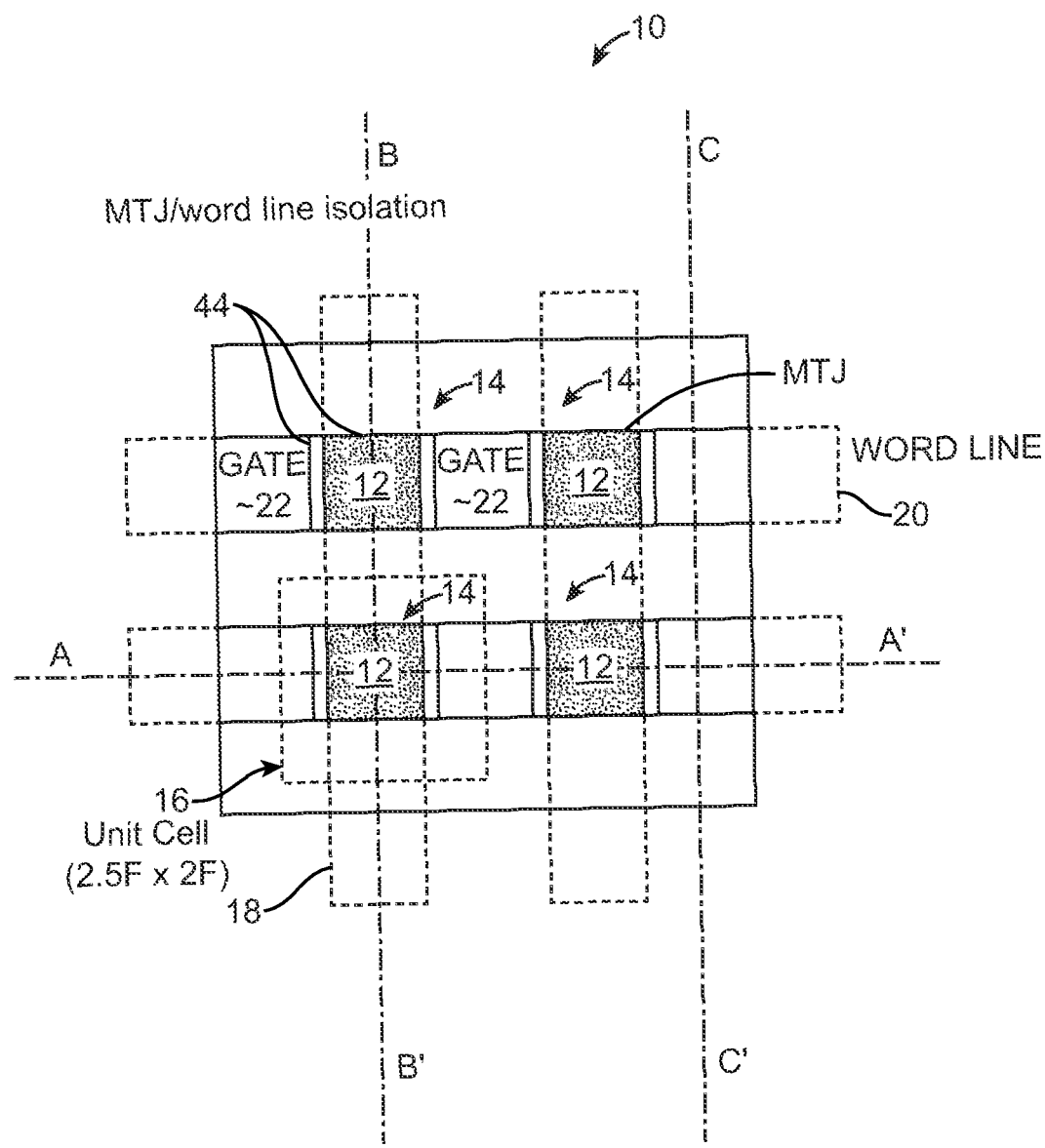
FIG. 2 shows a top view of a portion of a magnetic memory array 10, in accordance with an embodiment of the present invention.

FIG. 2 shows a top view of a portion of a magnetic memory array 10, in accordance with an embodiment of present invention. The array 10 is shown to include four magnetic memory cells 16, two appearing below the other two. Each magnetic memory cell 16 is shown to include a magnetic tunnel junction (MTJ) 12 and an access transistor 14, though only the gate 22 of each of the access transistors is visible due to the perspective of the view in FIG. 1. Each of the cells 16 is analogous to the cell 11 of FIG. 1.

As previously indicated, the gate 22 of the access transistor 14 is advantageously buried in the silicon substrate on top of which the array 10 is built in a manner where the gate 22 is approximately perpendicular to the plane of the silicon substrate.

Each MTJ 12 is shown coupled to a respective access transistor 14 by a bit line 18 and the gates of each of the transistors 14 are shown coupled to a word line 20. It is understood that the word line of each of the rows of the array 10, shown in FIG. 1, is different than the word line of other rows of the array 10. Similarly, the bit line of the each of the columns of the array 10, shown in FIG. 1, is different than the bit line of other column of the array 10. It is also understood that while four magnetic memory cells are shown included in the array 10, any number of magnetic memory cells may form the array 10. It is noted that in the embodiment of FIG. 2, the ratio "w" of the long axis to the short axis of MTJ 12 is equal to 1 but other dimensions are contemplated.

Each magnetic memory cell 16 is formed at the intersection of a word line 20 and a bit line 18. The cell 16 includes the gate 22, two isolation layers 44 and an MTJ 12 formed along the x-direction. As previously noted, the dimensions of the gate 22, the isolation layer 44 and MTJ 12, along the y-axis, are reduced respectively down to 1 F, 0.25 F and 1 F, in the embodiment of FIG. 2, as compared with prior art magnetic memory cells.

In some embodiments, each of the transistors 14 is a field enhanced transistor (FET) and as will be evident shortly, has a vertical channel-to-substrate (dual channel) surface plane to provide suitable program (electrical) current for programming of or writing to the MTJ and perhaps more importantly allowing for fabrication of high density memory arrays. Current drive is increased by approximately two times over that of prior art magnetic memory cells.

Figure 3:
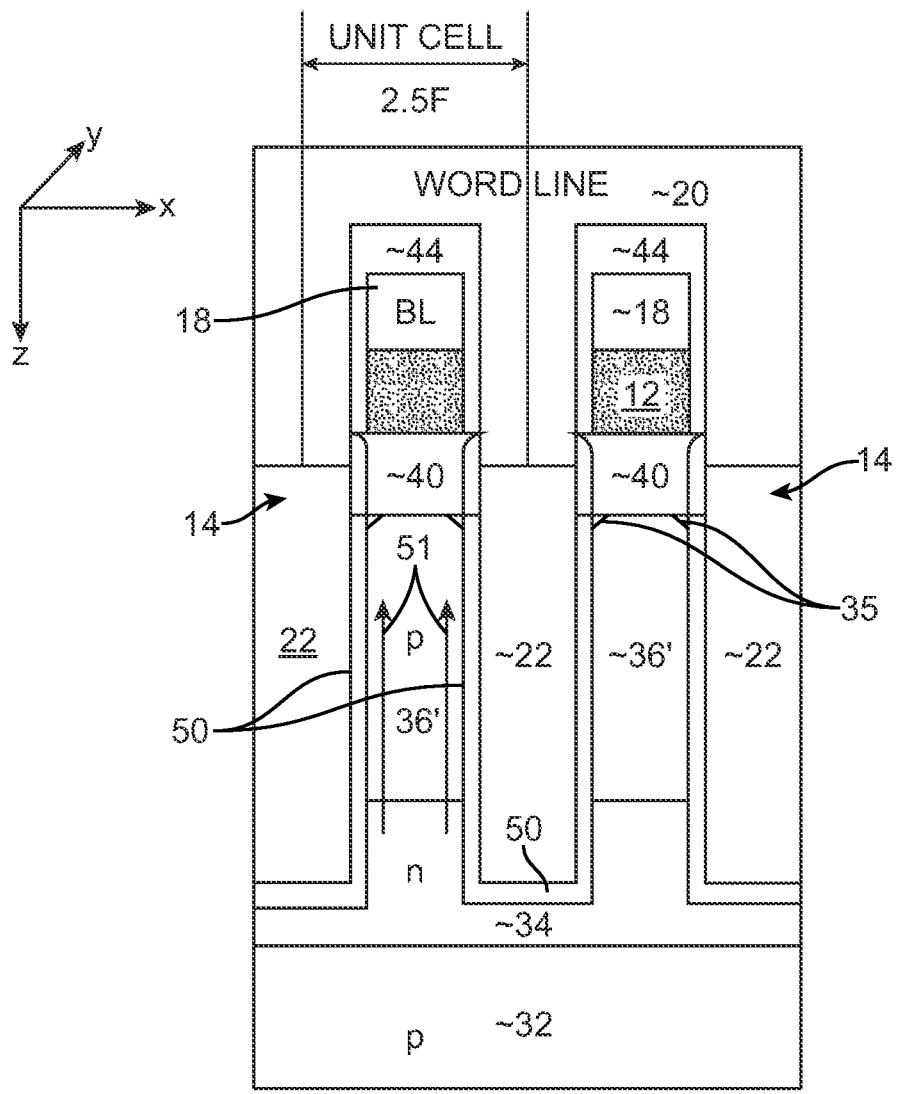
FIG. 3 shows a cross sectional view, along A-A', of FIG. 1.

FIG. 3 shows a cross sectional view, along A-A', of FIG. 2. The view in FIG. 3 of the array 10 shows the layers of the array 10 formed on top of the silicon substrate (also referred to herein as "underlying p-region" or "bottom p-region") 32. It is noted that only two of the four magnetic memory cells of FIG. 1 are visible in FIG. 3 because the remaining two are behind or in front of the two magnetic memory cells shown in FIG. 3 due to the perspective view thereof.

The transistor channel area (also referred to herein as the "overlying p-region" or "top p-region") 36' is shown formed on the source 34 and on top of the transistor channel area 36' is shown formed the drain 40. The source 34 is also referred to herein as the "source line". On top of the drain 40 is shown formed the MTJ 12 and on top thereof is shown formed the bit line 18 on top of which is shown formed the isolation layer 44 and on top thereof is shown formed the word line 20.

In FIG. 3, source 34 is shown formed on top of the silicon substrate 32 and in between the transistor channel area 36' and silicon substrate 32. On top of the source 34 and on the side and bottom of the gate 22, a gate oxide 50 is shown formed on top of which is shown formed the gate 22, in addition to the transistor channel area 36', each one of which forms a part of one of the cells 16. The gate 22 and the gate oxide 50 are shown buried in a portion of the transistor channel area 36', along the z-axis, and through approximately half of the n-region 34 along the x-axis.

On top of the area 36' is shown formed the drain 40 and on top thereof is shown formed the MTJ 12 and on top thereof is shown formed the bit line 18. On top of the bit line 18 is shown formed an isolation layer 44 and on top of the isolation layer 44 is shown formed the word line 20, which is additionally formed on top of the gate 22. As is known to those skilled in the art, in some embodiments, the isolation layer 44 is a dielectric. Each access transistor 14 is coupled to and used to access a respective MTJ 12 and made of the drain 40, the gate 22 and the source 34.

The channel 51, which is formed of two channels and is therefore a "dual channel", with each channel formed in the area 36' adjacent to the gate 22.

As shown in FIG. 3, the gate 22 is coupled to the word line 20. Advantageously, the bit line 18 couples a MTJ 12 to a respective access transistor 14 in a direction along the width of the dual channel 51 of the access transistor 14 and the word line 20 couples the gate 22 of the access transistor, which is vertical or in the z-axis direction, in a direction along the channel 51's length crossing over the bit lines, thereby causing the gate 22 of the access transistor to be buried under the plane of the silicon substrate, increasing the available space on the plane of the silicon substrate leading to an increased density of the array 10.

Figure 4:
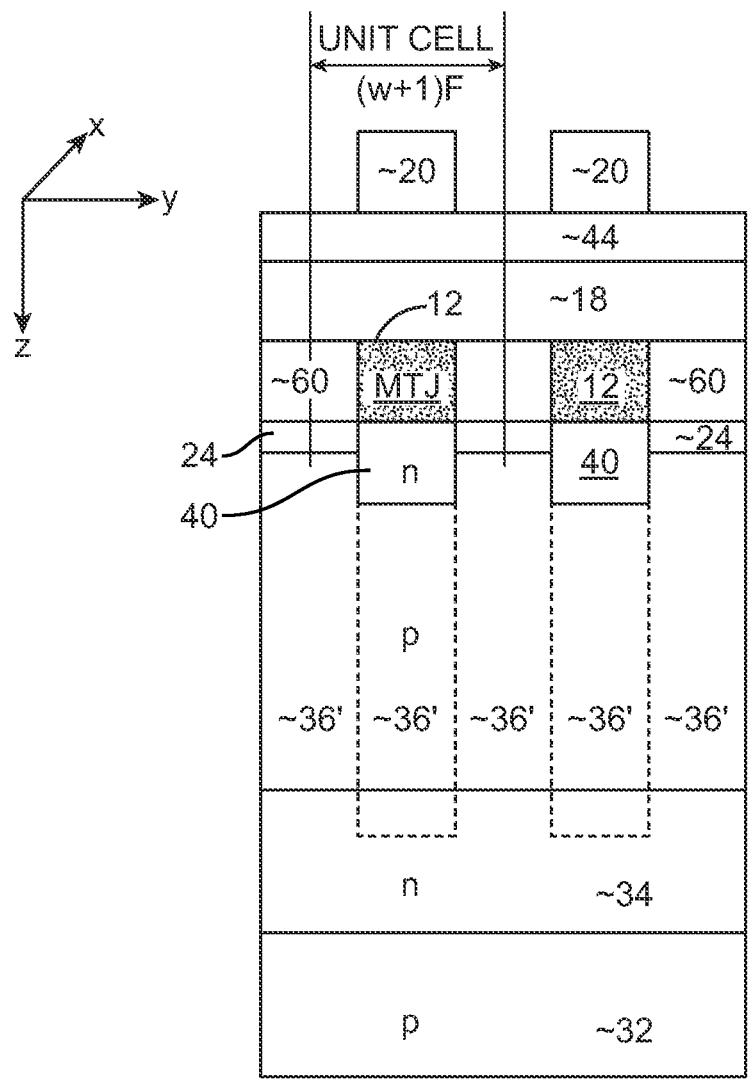
FIG. 4 shows a cross sectional view, along B-B', of FIG. 1.

FIG. 4 shows a cross sectional view, along B-B', of FIG. 2. It is noted that the drawing of FIG. 4 is merely virtual and not apparently visible after the fabrication of the array 10. In the perspective view of FIG. 4, one of the magnetic memory cells shown in FIG. 2 is also shown in FIG. 4 and that is the magnetic memory cell 16 that appears in FIG. 3 at the left of the figure and includes the transistor channel area 36'. Additionally, in FIG. 4, another magnetic memory cell is shown to the right of the figure, and this cell is not shown in FIG. 3 but shown in FIG. 2, on top of the cell shown to include the p-region 36. Thus, in FIG. 4, the two magnetic memory cells 16 of FIG. 2 that are shown are the two on the left side of FIG. 2 that are also shown in the same column. Accordingly, in FIG. 4, the magnetic memory cell appearing at the right side of this figure, is shown to include the area 36', shown formed on top of the source 34. Isolation layer 24 is shown formed on top of the area 36' excluding those surfaces of area 36' that are covered with drain 40 and serves to isolate area 36' from the next layer that is formed on top of the isolation layer 24. In some embodiments, isolation layer 24 is made of dielectric.

Dashed lines below the drain 40 trace the gate 22 for ease of viewing and are actually not visible in the cross section view shown in FIG. 4. The channel 51, while not shown in FIG. 4 due to the perceptive view thereof, is formed in between the drain 40 and the source 34, within the dashed lines and behind the area 36'. In the portions shown on top of the area 36', in FIG. 4, there is further shown drain 40 and on top of the drain 40 is shown formed an MTJ 12 in FIG. 4, and on top of the MTJ 12 is shown formed the bit line 18. The MTJ 12 is isolated by isolation layer 60, which is formed on top of the isolation layer 24. The bit line 18 is additionally formed on top of the isolation layer 60 and the MTJ 12. The layer 60 is also made of dielectric.

On top of the bit line 18 is shown formed the layer 44 and on top of the layer 44, substantially above each MTJ 12, is shown formed a word line 20 used to provide gate voltage. Additionally, in FIG. 4, the isolation 60 is visible even though it is not visible in FIGS. 2 and 3. The visibility of the isolation 60 is due to the virtual view shown in FIG. 4. The isolation 60 is shown formed on top of the area 36' except in regions where a MTJ 12 appears. Thus, the isolation layer 60 is formed between the isolation layer 24 and the bit line 18 except in areas where the MTJs 12 are formed.

Figure 5:
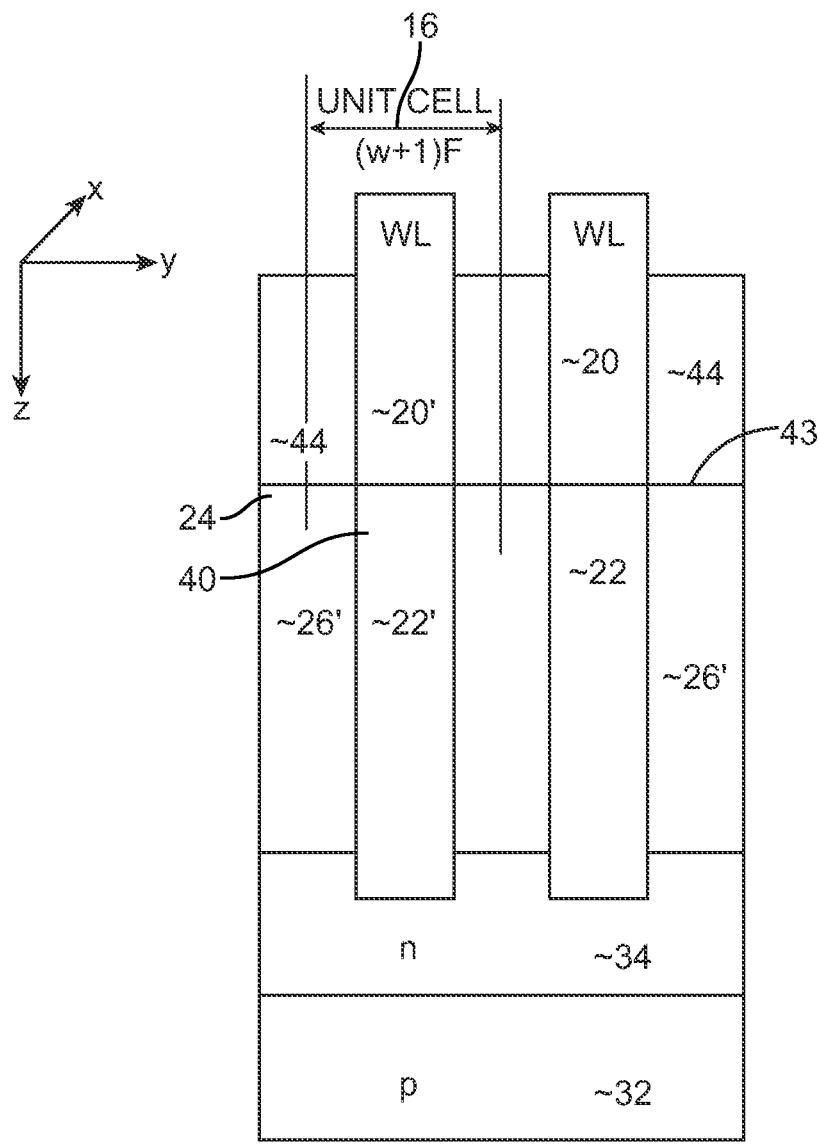
FIG. 5 shows a cross sectional view, along C-C', of FIG. 1.

FIG. 5 shows a cross section view of the array 10, along C-C', of FIG. 1. On top of the source 34 is shown formed substrate 26' except in areas where the gate 22 is formed in the substrate 26'. The substrate 26' is made of the same material as the silicon substrate 32, known to those in the art. The gate 22 is isolated from each other by substrate 26' and from the source 34 by the gate oxide 50. The word line 20 is shown coupled to the gate 22. The substrate 26', in some embodiments, is made of silicon oxide.

Figure 6:
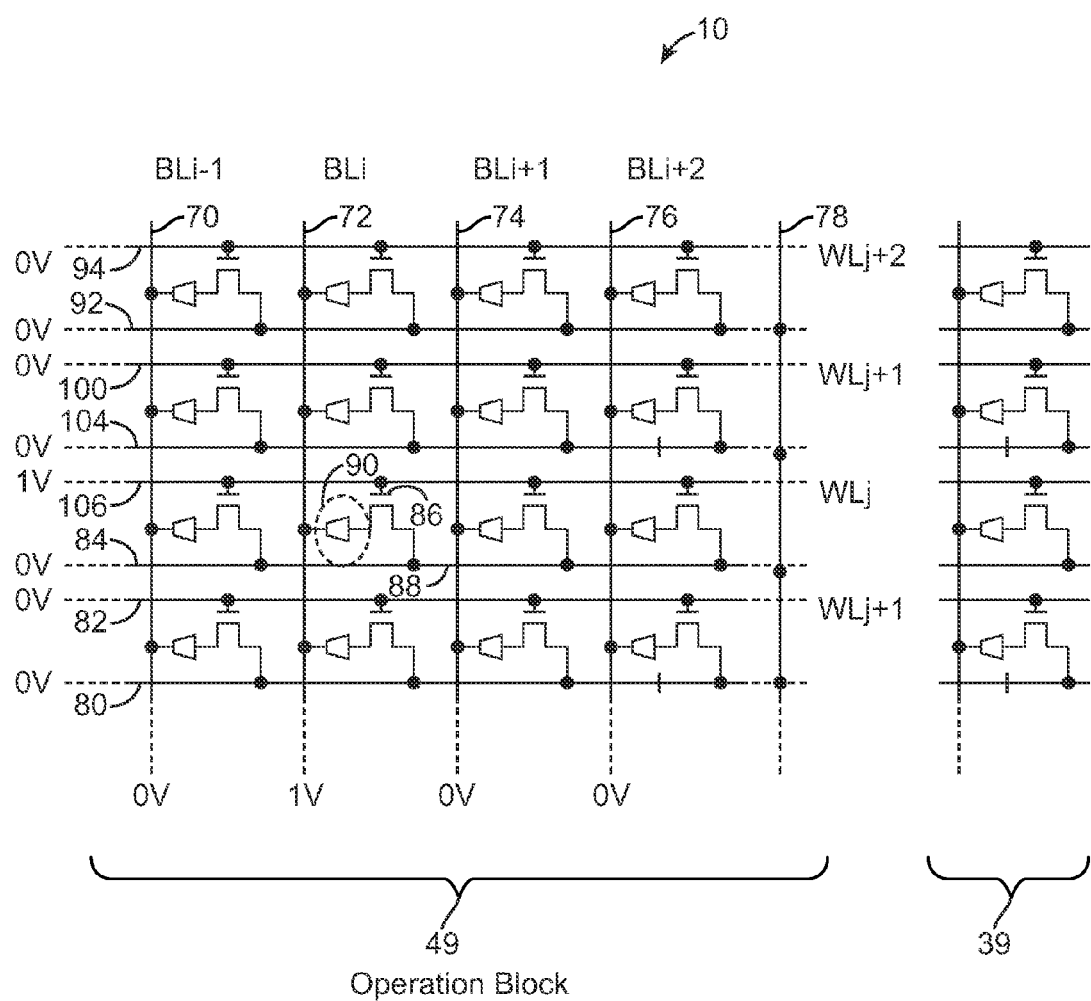
FIG. 6 shows a high level diagram of the array 10 of FIG. 1 including additional magnetic memory cells 16.

FIG. 6 shows a portion of the array 10 of FIG. 2 that includes a group of magnetic memory cells. FIG. 6 is intended to demonstrate the operation of the array 10 when programming one of the MTJs thereof, by way of example. The example of FIG. 6 selects the magnetic memory cell 88, out of the magnetic memory cells 16, to access.

More specifically, in FIG. 6, five out of many other number of bit lines are shown, these are bit lines 70-78. The MTJs of the array 10 of FIG. 6 are the same as the MTJs 12 of FIG. 1 except that there are more of them shown in FIG. 6. A group of magnetic memory cells along with associated bit and word lines comprise the operation block 49, which is accessed for programming/reading. The operation block 39 is shown to include four rows and 5 columns of magnetic memory cells. The bit lines are shown coupled to one side of each of the MTJs 12 with the other side of the MTJs each being coupled to a respective access transistor 14. Four of many other word lines are also shown in FIG. 6. These word lines 82, 106, 100 and 94 are each coupled to a respective magnetic memory cell at the gate of each of the access transistors 14. By way of example, word line 106 is coupled to the gate of the access transistor 88 of the magnetic memory cell 86. Accordingly, each magnetic memory cell is shown to include an MTJ and an access transistor. The drain of each of the each of the access transistors is shown coupled to the side of the MTJ, for example the drain of the access transistor 86 is shown coupled to one side of the MTJ 90, namely, the side of the MTJ that is not coupled to a bit line and the source of each of the access transistors is shown coupled to a source line. For example, the source of the access transistor 86 is shown coupled to the source of the access transistor 86. There are four source lines, 80, 84, 108 and 92, shown out of many others, in FIG. 6. Each source line is shown coupled to the source of an access transistor. For example, the source line 84 is shown coupled to the source of the access transistor 88.

In the example of FIG. 6, during operation of the array 10, to select the magnetic memory cell 86, the bit lines 70, 74 and 76 are at approximately 0 volts and the bit line 72 is at approximately 1 volt. It is understood that in other embodiments, this polarity may be switched where the bit lines 70, 74, and 76 are at 1 volt and the bit line 72 is at 0 volts. Further, the voltages at the lines 80, 82, 84, 108, 100, 92 and 94 are all at 0 volts and the voltage at word line 106 is approximately 1 volt. This type of configuration, in FIG. 6, allows either to write a logical value '2' (or high) into the MTJ 90 or to read the MTJ 90. To write a low or '0' state into the MTJ 90, in the example of FIG. 6, the polarities of all lines are the opposite to that state above. That is, the lines 80, 82, 84, 108, 100, 92 and 94 are all at 1 volt and the voltage at word line 106 is approximately 0 volts and the voltage at bit lines 70, 74, 76 and 78 are each at 1 volt and the bit line 72 is at 0 volts. Again, in other embodiments, the designer may choose an opposite polarity. More generally, to write state "1" to a selected magnetic memory cell or to read the state of the selected magnetic memory cell, a positive voltage is applied to a selected bit line BLi and a selected word line WLj. 0V is applied to non-selected bit lines other bit lines than BLi, non-selected word lines other than WLj and source plates. To write state "0", a positive voltage is applied to non-selected bit lines, a selected word line WLj and selected source line SLk and 0 volt is applied to selected bit line BLi, non-selected word lines and non-selected source plates.

A target (or selected) memory cell, such as the cell comprising MTJ 90 and access transistor 86, is selected by one of the source lines, one of the bit lines, such as among the bit lines 70-78, and one of the word lines, such as among the word lines 80-84, 104, 106, 100, 92 and 94. In FIG. 6, the source lines are not shown but are readily known to be connected to each other working as a source plate. To reduce capacitance, the source plate is typically made of a number of source plates with the number of source plates being a function of the size of the memory array.

In FIG. 6, the bit line that is activated to select a magnetic memory cell, such as the bit line 72, is referred to herein as "selected", similarly, the source line and word line that are activated to select a cell are referred to herein as "selected", whereas, all other bit lines, source lines and word lines, not activated, are referred to as "non-selected". To this end, the following Table 1 provides the operation voltages, positive (+) or 0 volt for programming a '0' (low) and '2' (high) in the MTJ 90, with the access transistor 86 presumed to be an NMOS type of transistor.

TABLE 1

| | BIT LINE | | WORD LINE | | |
|---|---|---|---|---|---|
| | SELECT | NO SELECT | SELECT | NO SELECT | SOURCE |
| READ | + | 0 | + | 0 | 0 |
| WRITE HI | + | 0 | + | 0 | 0 |
| WRITE LOW | 0 | + | + | 0 | + |

Additionally, in Table 1, "+" represents positive voltage and "0" represents 0 volts.

Figure 7:
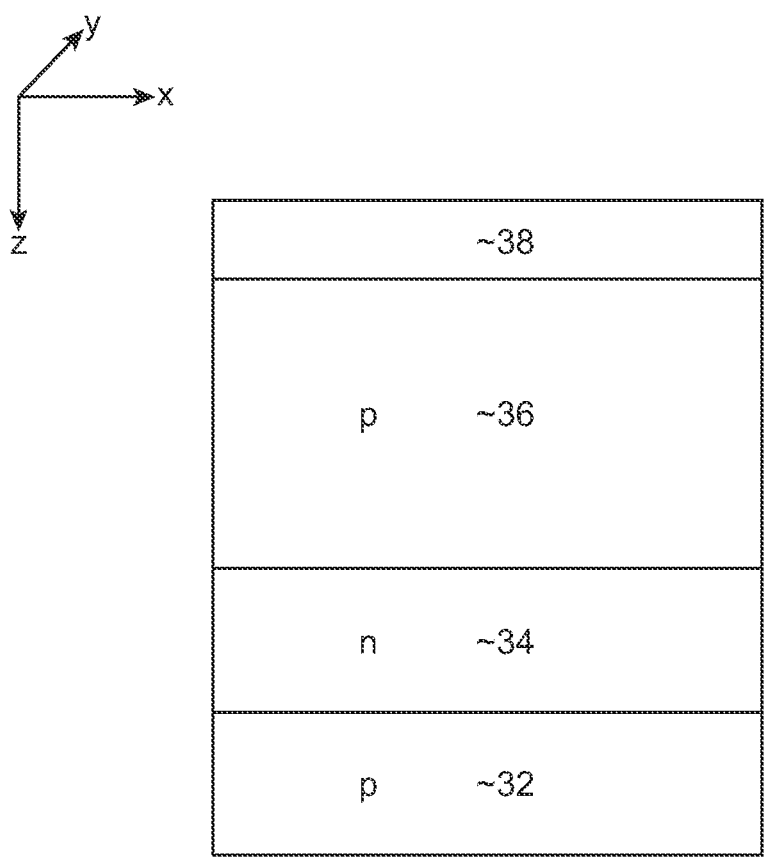
FIGS. 7-16 show, in relevant part, a method of fabricating the array 10, in accordance with a method of the present invention.

FIGS. 7-16 show, in relevant part, a method of the array 10, in accordance with a method of the present invention. The view shown in FIG. 7 is the same as that of FIG. 3, which is cross section B-B' of FIG. 2. FIG. 7 shows the source 34 formed between the silicon substrate 32 and the area 36. It is noted that the area 36 becomes the area 36' upon completion of the subsequent steps and is therefore made of the same material. All of the layer formations, discussed herein, use well known epitaxial silicon growth over p-substrate or ion implantation in p-substrate. The area 36 is advantageously adjustable in its length (or the y-axis direction) therefore the channel length can be adjusted to prevent punch through leak without penalty to the area 36. Silicon nitride 38 is shown deposited on top of the area 36 in FIG. 7.

Figure 8:
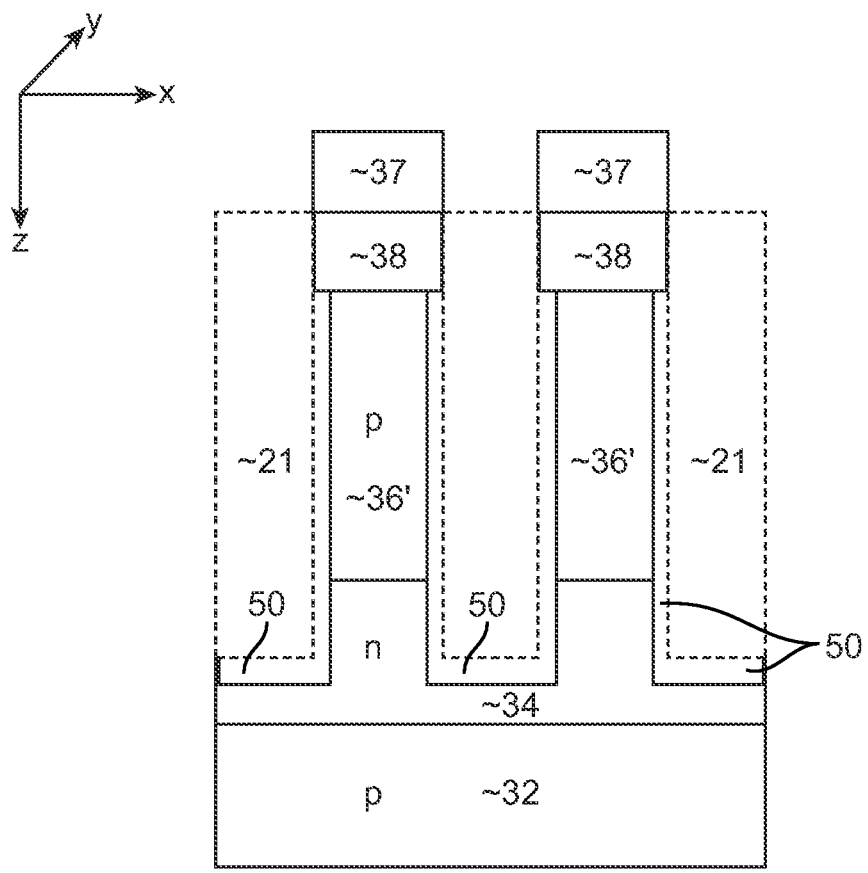

FIG. 8 shows the next step in the process for fabricating the array 10, after the completion of the step of FIG. 8 where trench 21 is formed for preparation of the formation of the gate 22. Photoresist pattern 37 is shown patterned on top of the silicon nitride 38 and serves as an etching mask.

During the etching step of FIG. 8, reactive ion etching transfers the photoresist pattern 37 into silicon nitride 38, transistor channel area 36' and approximately half of the source 34 to form a trench 21. Due to the etching process, the silicon nitride 38 is not etched but the area 36, of FIG. 7, is etched in the areas defined by the trench 21 thereby creating the area 36'. After the etching step of FIG. 8, pattern 37, which in some embodiments is made of photoresist, is stripped with a conventional process. The surface in the trench 21, which is made of silicon, is oxidized using a conventional oxidation process to form the gate oxide 50.

Figure 9:
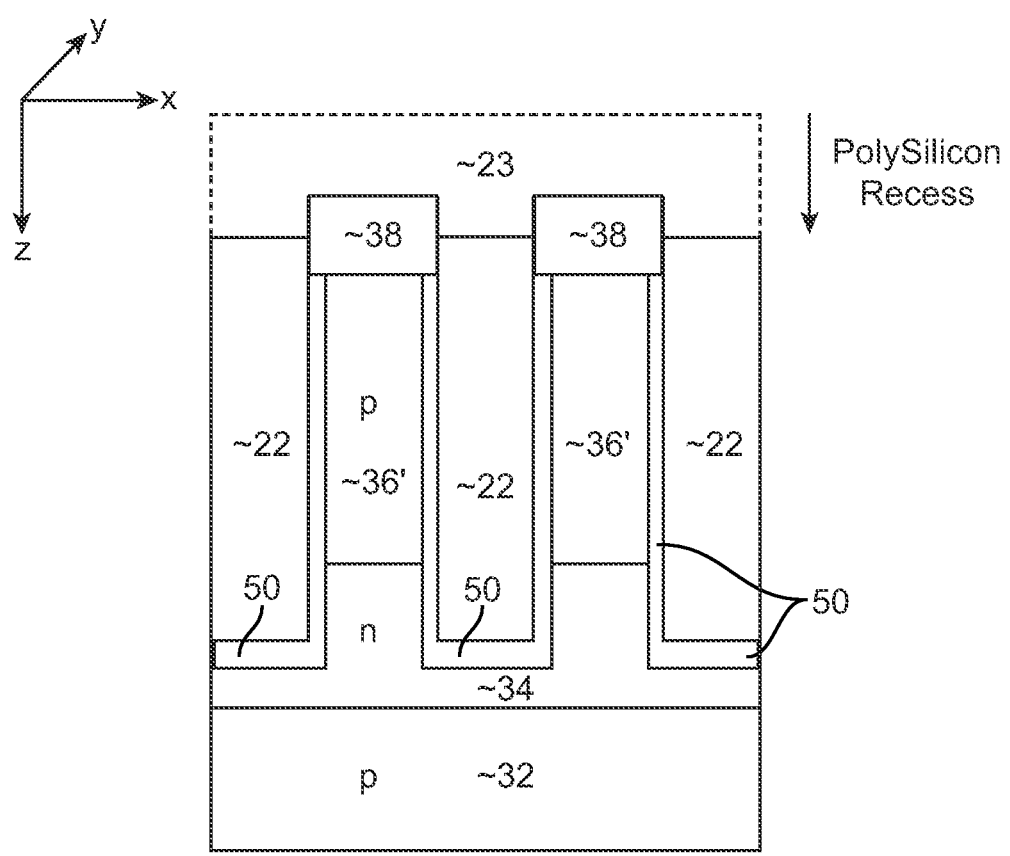

FIG. 9 shows the next step in the fabrication process of the array 10 after the step in FIG. 8 completes. Gate 22, which is made of polysilicon is deposited on top of the silicon nitride 38 and in the trench 21 using a conventional Chemical Vapor Deposition (CVD) process. It is noted that the top of the gate 22 is lower than the top of the silicon nitride 38. Next, excess polysilicon 23, defined by the polysilicon appearing above the gate 22 and on top of the silicon nitride 38 is removed using vertical dry etching down to the top of the gate 22. Polysilicon 23 is therefore excess polysilicon that covers the gate 22 and the silicon nitride 38 and is removed by polysilicon recess process using vertical dry etching, well known in the art.

Figure 10:
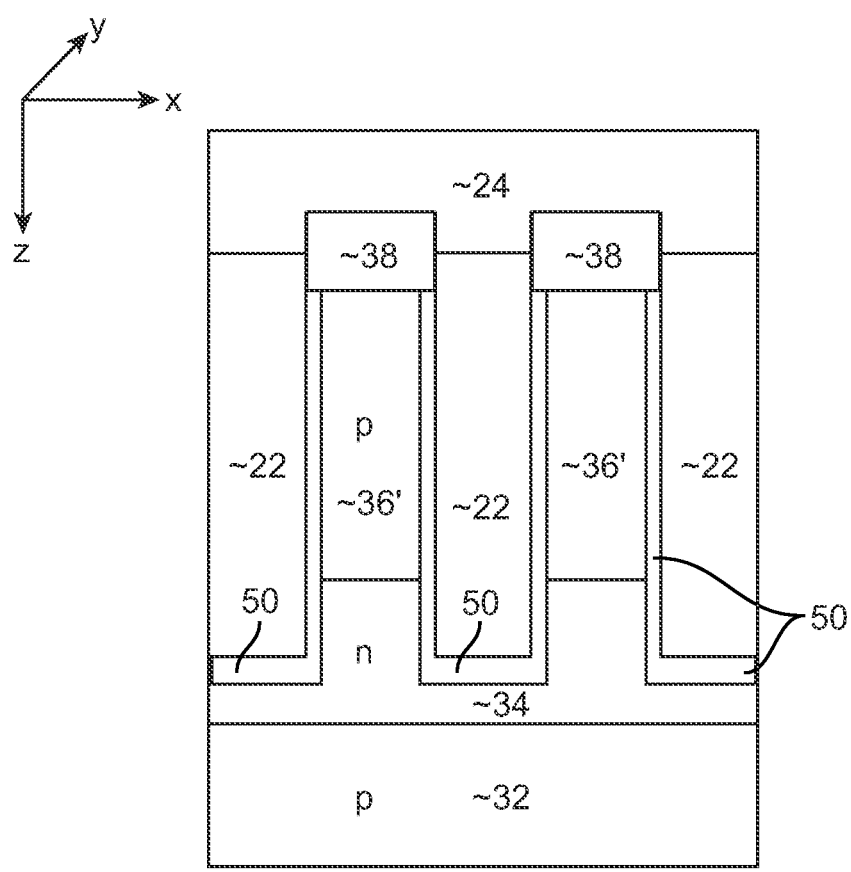

FIG. 10 shows the next fabrication process where silicon oxide layer 24 is deposited on the top of the structure in FIG. 9. More specifically, layer 24 fills the polysilicon 23 of FIG. 9. The layer 24 is used as a hard mask to isolate the gate 22 for reasons that will become apparent shortly.

Figure 11:
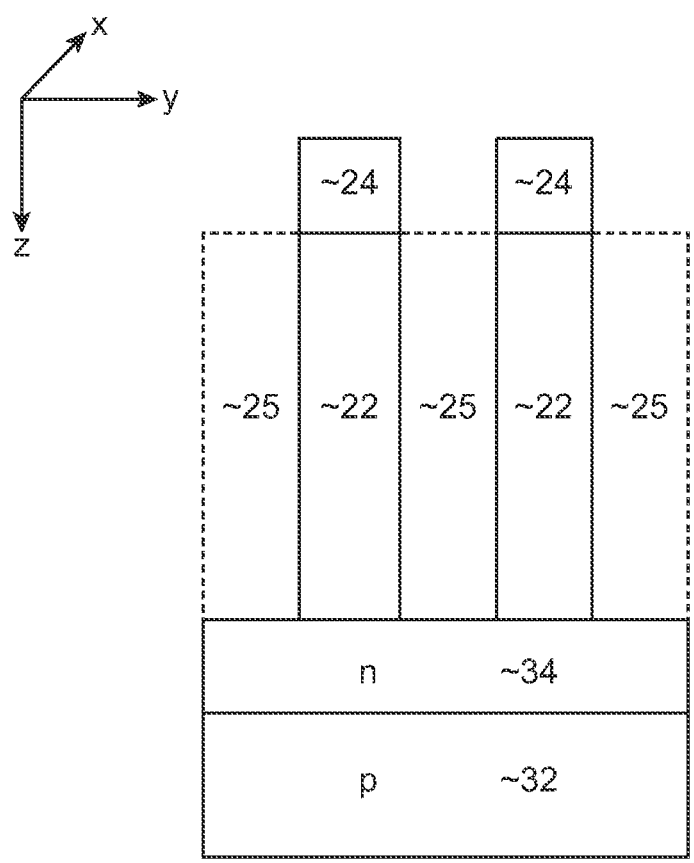

FIG. 11 shows the next step in the fabrication process of the array 10. FIG. 11 offers a perspective view along C-C' of FIG. 2. In FIG. 11, a photoresist image, printed using conventional photolithography techniques, is transferred into the layer 24. The image transferred into the layer 24 is further transferred into gate 22 thereby creating trench 25.

Figure 12:
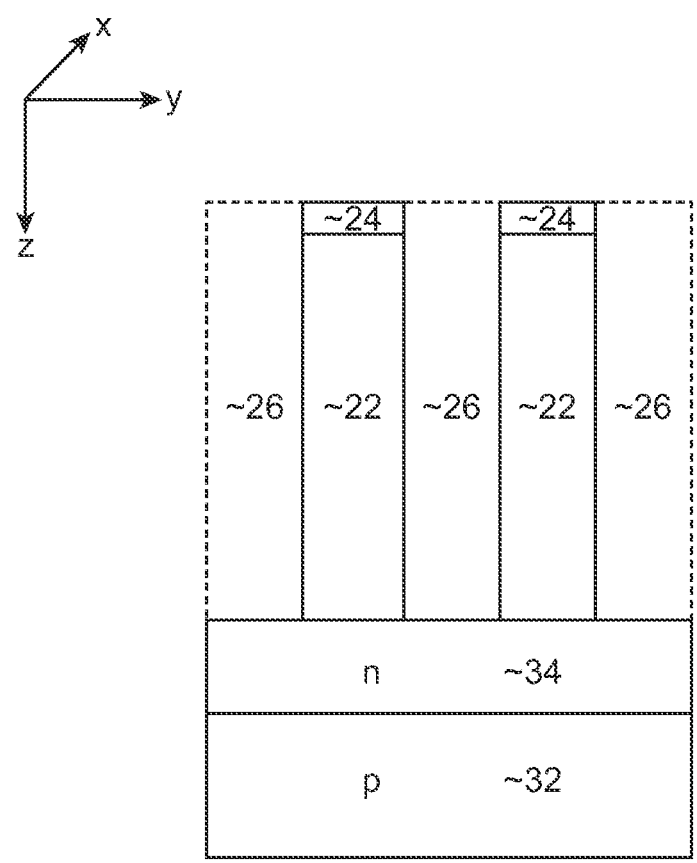

Next, in FIG. 12, an oxide layer 26 is deposited into the trench 25 thereby filling the trench 25 and then, chemical mechanical polishing (CMP) is performed to planerize the surface of the layer 26. CMP is stopped at the silicon nitride 38 (not shown in FIG. 10 due to the perspective thereof).

Figure 13:
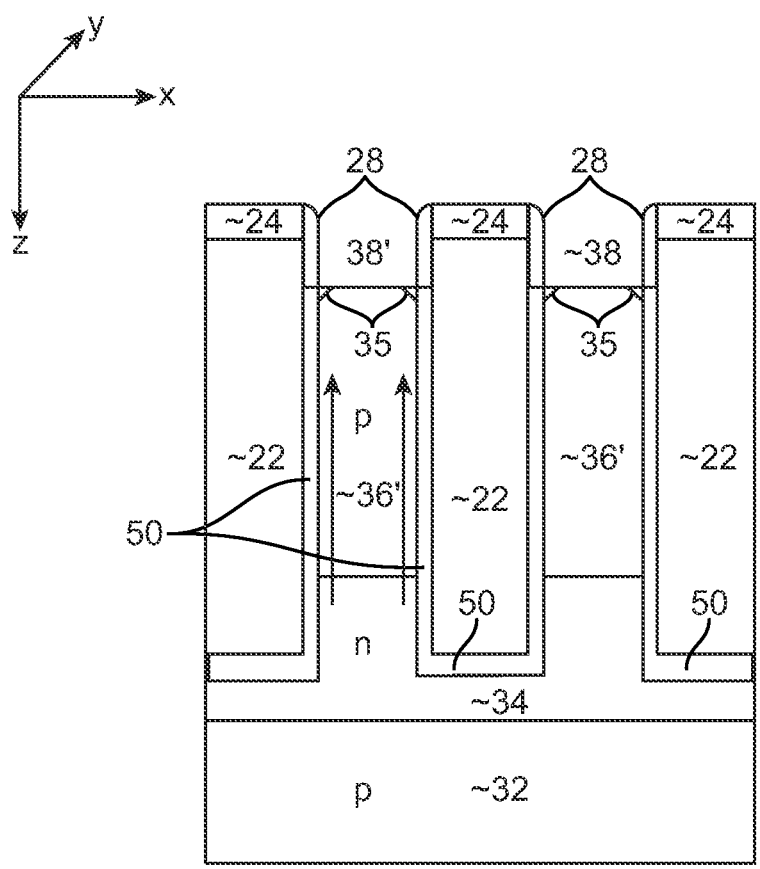

FIG. 13 shows the process after the process of FIG. 12 where the silicon nitride 38 is removed by hot phosphoric acid and forms a trench 38'. The view of FIG. 13 is along the cross-section B-B'. Angled ion Implantation, well known in the art, may create lightly doped drain (LDD) 35. Isolation 28, which is used to isolate the gate polysilicon 22, is formed with spacer etching process.

Figure 14:
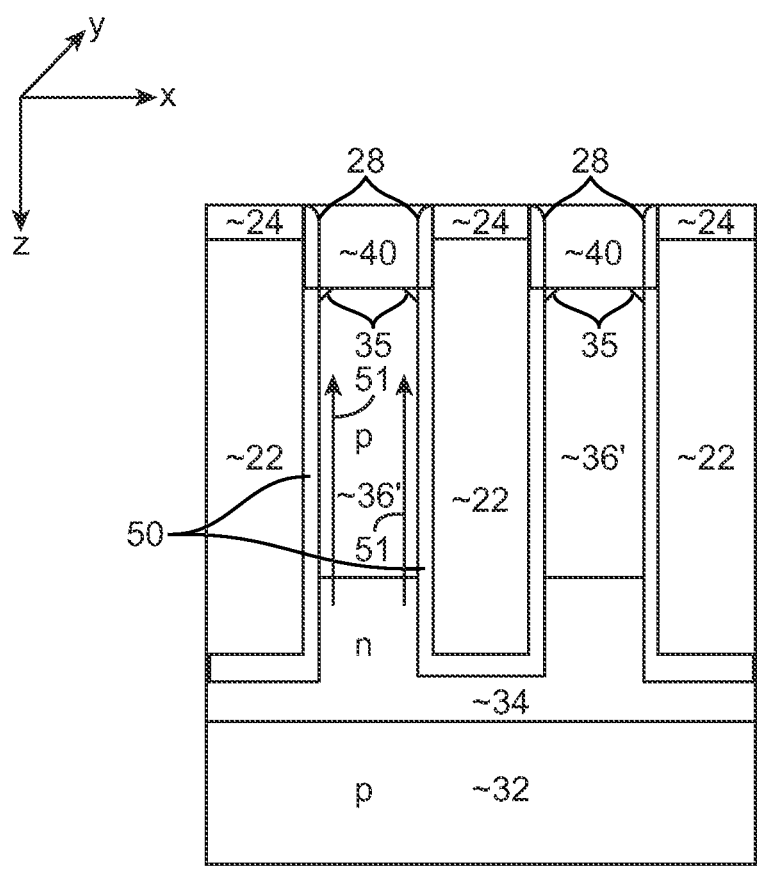

FIG. 14 shows the process after the process of FIG. 13 where drain 40 is formed by filling the trench 38' with n-polysilicon and the drain 40 is planarized with CMP to remove silicon from the surface of the structure formed thus far.

Figure 15:
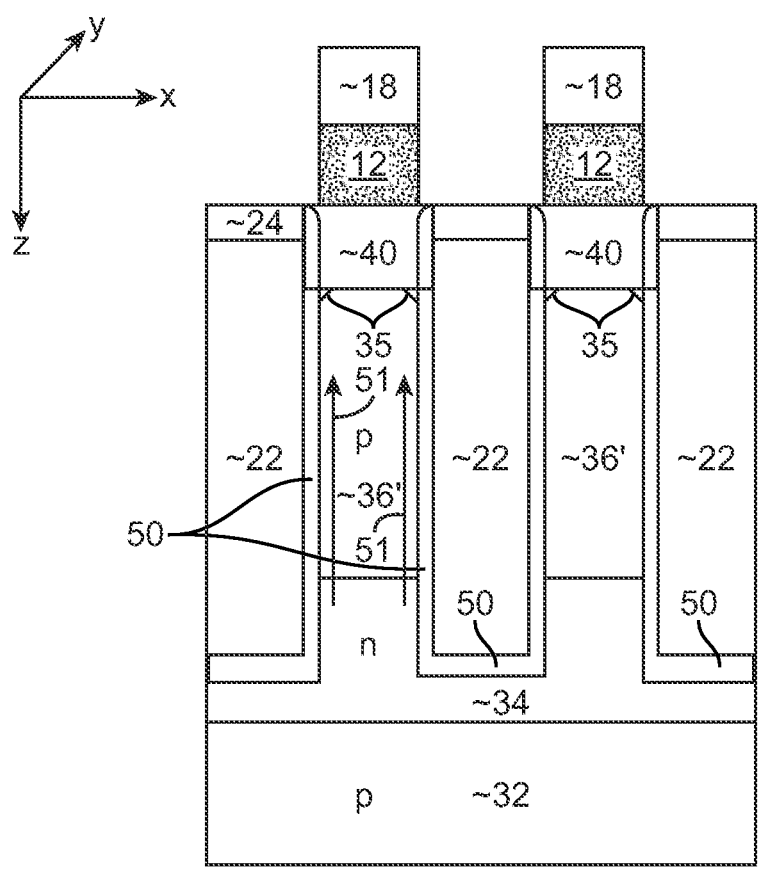
Figure 16:
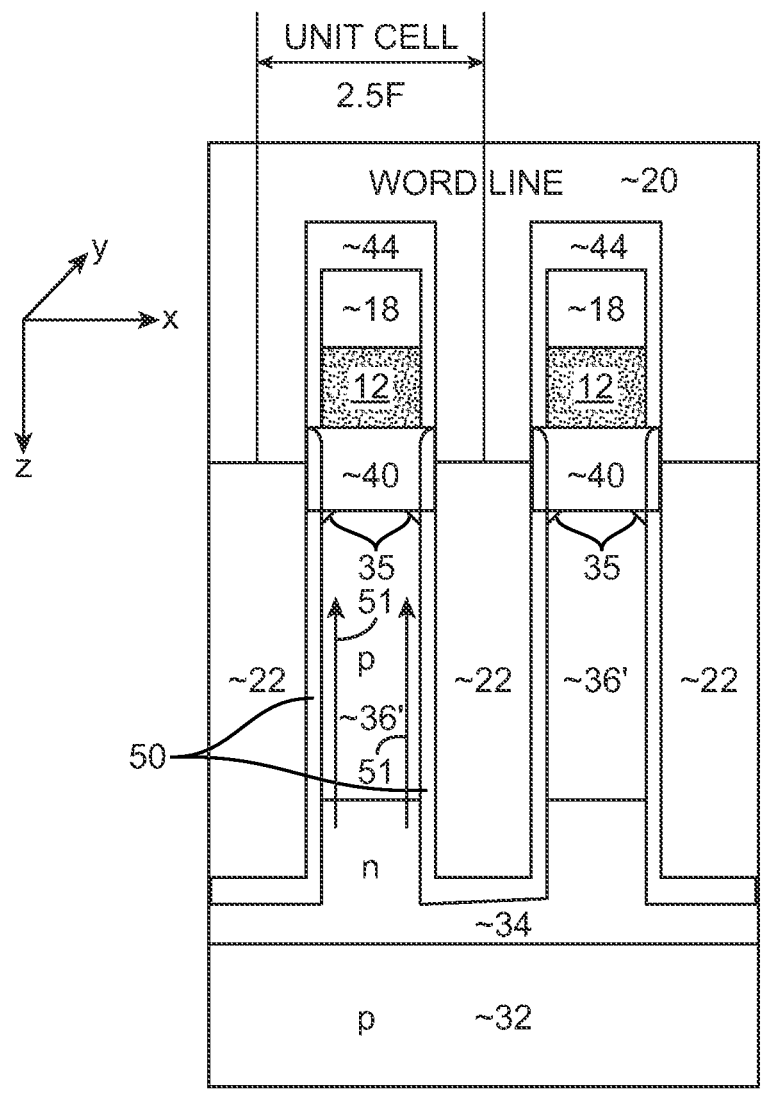

After the steps of FIG. 15 each MTJ 12 is formed, as shown in FIG. 16, on top of a respective drain 40 and on top of each MTJ, there is formed the bit line 18. It is noted that the MTJ includes a stack of layers having a top and bottom electrodes, as well known in the art. This is done by the MTJ 12 being patterned with a conventional process and interconnected to the bit line 18 using conventionally methods.

Finally, in FIG. 16, the isolation layer 44 is formed on top and around the bit line 18 and around the MTJ 12 and then, the word line 20 is formed on top of the gate 22 and the isolation layer 44 thereby coupling to the gate 22.

It is contemplated that in alternative embodiments, rather than the MTJ 12 of magnetic memory array 10, other types of suitable memory may be employed with the gate of the access transistor accessing the memory is buried in the silicon substrate or substantially perpendicular to the plane of the silicon substrate, as shown and discussed herein. Examples of such memory include a phase shift memory, resistive memory or any other memory having a switching memory element. In these cases, the MTJ 12 would not be present and other memory elements, known in the field, are substituted therefore.

Although the present invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A magnetic memory cell including a magneto tunnel junction (MTJ) accessed for reading and writing, the magnetic memory cell comprising:
    a source formed in a silicon substrate;
    a transistor channel area formed in a portion of the source;
    a gate formed on a different portion of the source and substantially adjacent to the transistor channel area where a first channel is formed and a second channel formed on an opposite side of the first channel;
    a drain formed on top of the transistor channel area, the drain, the gate, and the source collectively comprising an access transistor operative to access a magneto tunnel junction (MTJ);
    the MTJ formed on top of and coupled to the drain and operative to be accessed by the access transistor;
    a bit line formed on top of and coupled to the MTJ; and
    a word line formed above the bit line and coupled to the gate,
    wherein the source, the drain, the gate, and the transistor channel area are buried in the silicon substrate.

2. The magnetic memory cell, as recited in claim 1, further comprising a gate oxide formed on either side or the gate, between the gate and the transistor channel area.

3. The magnetic memory cell, as recited in claim 1, further comprising an isolation layer formed on top of the bit line.

4. The magnetic memory cell, as recited in claim 1, wherein the magnetic memory cell is 5 $F^2$.

5. The magnetic memory cell, as recited in claim 1, wherein the source is made of n-region, the drain is made of n-region and the transistor channel area is made of p-region.

6. The magnetic memory cell, as recited in claim 1, wherein the source is made of p-region, the drain is made of p-region and the transistor channel area is made of n-region.

* * * * *